(12) United States Patent
Woyda-Wolf

(10) Patent No.: US 7,639,040 B2
(45) Date of Patent: Dec. 29, 2009

(54) ASSEMBLY WITH A MECHANICALLY INACCESSIBLE OR DIFFICULT-TO-ACCESS CIRCUIT AND METHOD FOR SWITCHING THE OPERATING STATE OF AN ASSEMBLY

(75) Inventor: Martin Woyda-Wolf, Strasslach-Dingharting (DE)

(73) Assignee: Robert Bosch GmbH, Stuttgart (DE)

( * ) Notice: Subject to any disclaimer, the term of this patent is extended or adjusted under 35 U.S.C. 154(b) by 487 days.

(21) Appl. No.: 11/621,231

(22) Filed: Jan. 9, 2007

(65) Prior Publication Data
US 2007/0165350 A1 Jul. 19, 2007

(30) Foreign Application Priority Data
Jan. 13, 2006 (DE) .................. 10 2006 001 729

(51) Int. Cl.
*H03K 19/173* (2006.01)
(52) U.S. Cl. .......................... 326/38; 326/82
(58) Field of Classification Search ............ 326/37, 326/38, 82
See application file for complete search history.

(56) References Cited

U.S. PATENT DOCUMENTS

| 4,533,841 | A | * | 8/1985 | Konishi | 326/38 |
| 5,200,652 | A | * | 4/1993 | Lee | 326/47 |
| 6,100,747 | A | * | 8/2000 | Confalonieri | 327/525 |
| 6,437,959 | B1 | | 8/2002 | Andrieu et al. | |
| 6,462,609 | B2 | * | 10/2002 | Hashimoto et al. | 327/525 |
| 2005/0002262 | A1 | | 1/2005 | Huang et al. | |
| 2005/0151578 | A1 | | 7/2005 | Huang et al. | |
| 2006/0119415 | A1 | * | 6/2006 | Fukuda et al. | 327/525 |

FOREIGN PATENT DOCUMENTS

| DE | 101 60 113 | 6/2003 |
| EP | 0 652 567 | 5/1995 |
| GB | 2 409 117 | 6/2005 |

\* cited by examiner

*Primary Examiner*—Don P Le
(74) *Attorney, Agent, or Firm*—Michael J. Striker

(57) ABSTRACT

An assembly has a mechanically inaccessible or difficult-to-access circuit, which has an electrical component that is irreversibly changeable by a current pulse; the irreversible change of the component is capable of switching the circuit from a first operating state into a second operating state, wherein the assembly has mechanically accessible supply lines via which it is possible to supply the current pulse for the irreversible change of the electrical component.

4 Claims, 1 Drawing Sheet

ASSEMBLY WITH A MECHANICALLY INACCESSIBLE OR DIFFICULT-TO-ACCESS CIRCUIT AND METHOD FOR SWITCHING THE OPERATING STATE OF AN ASSEMBLY

CROSS-REFERENCE TO A RELATED APPLICATION

The invention described and claimed hereinbelow is also described in German Patent Application DE 10 2006 001 729.3, filed Jan. 13, 2006. This German Patent Application, whose subject matter is incorporated here by reference, provides the basis for a claim of priority of invention under 35 U.S.C. 119 (a)-(d).

BACKGROUND OF THE INVENTION

The invention relates to an assembly with a mechanically inaccessible or difficult-to-access circuit, which has an electrical component that can be irreversibly changed by a current pulse; the irreversible change of the component is capable of switching the circuit from a first operating state into a second operating state. The invention also relates to a method for switching the operating state of an assembly.

In a multitude of applications, assemblies are only finally configured for their intended purpose upon initial operation or installation. The use of adaptable circuits permits the manufacturer to avoid having to produce and store a multitude of hard-wired assembly variants and instead to stock a supply of a single type of configurable assembly.

It is for example customary to adapt parts of a communications system to special requirements during installation. The adaptation is often carried out by means of so-called jumpers, i.e. pluggable bridging contacts, encoding switches, or other mechanical components. Another known method is the use of differently programmed memory chips.

European Patent Disclosure EP 0 652 567 A2 has disclosed a device and a method for adapting analog integrated circuits on a chip, which are encapsulated in a plastic housing. To this end, in addition to the actual circuit, the chip has an adaptation circuit with an interruptible electric element such as a fuse, a status detection unit for detecting the status of the electric element, a current source for generating a current for interrupting the electrical element, and a test state detection unit that also detects partially interrupted electrical elements. The actual circuit and the adaptation circuit are situated together on the same chip and are encapsulated together in the plastic housing.

SUMMARY OF THE INVENTION

Accordingly, it is an object of the present invention to provide an assembly and a method for switching its operating state, which avoids the disadvantages of the prior art.

The present invention proposes an assembly with a mechanically inaccessible or difficult-to-access circuit, and a method for switching the operating state of an assembly.

The assembly according to the invention includes a circuit. The circuit in the assembly is mechanically inaccessible or difficult-to-access. The insufficient, nonexistent, or poor accessibility can be due to the fact that the circuit is only accessible by means of an irreversible mechanical access and/or on the fact that it requires a multitude of work steps in order to mechanically access the circuit and/or on the fact that the circuit is encapsulated, in particular is cast and/or sealed.

The circuit is preferably embodied in the form of an equipped circuit board and/or an equipped substrate, in particular in a two-dimensional or three-dimensional arrangement. Preferably, the circuit has a multitude of electrical or electronic individual components such as resistors, capacitors, and transistors that are joined to one another by means of an attachment process such as soldering or welding.

The circuit has a component that can be irreversibly changed by means of a current pulse; the change occurs for example by means of the thermal energy that is produced when the current pulse is routed through a conductor. Preferably, the component has two discrete states.

The component is situated and/or connected in the circuit so that as a result of its change, the circuit can be switched from a first operating state into a second operating state, it being assumed that these are functioning operating states. When the operating state changes occur, preferably changes are made to electrical/electronic parameters such as the level of supply voltage, the frequency of the supply voltage and/or to IT-related parameters such as the number of activated information channels, the selection of a transfer protocol, or a software module.

In alternative embodiments, a multitude of such components and/or components with more than two discrete states can be provided in order to switch between more than two operating states of the circuit.

According to the invention, the assembly has mechanically accessible supply lines via which the current pulse can be supplied in order to irreversibly change the electrical component. In particular, the supply lines at least lead from the mechanically inaccessible and/or difficult-to-access circuit and are mechanically accessible from the outside or from a point external to the assembly. The mechanical accessibility is achieved if the supply lines have mechanical interfaces such as bushings, plugs, or even merely freely extending cable ends and/or are embodied as such.

The invention is based on the concept that there is a large savings potential in production-related and logistical expenses if only a single type of assembly has to be produced and manipulated, which can then be converted into another variant during installation, without incurring special expense. This is achieved in that the assemblies can be adapted by means of a current pulse that can be supplied via mechanically accessible supply lines. In addition, this adaptation should be stable and should not be susceptible to being cancelled by external influences (e.g. EMI), which is achieved through the use of an irreversibly changeable component. There is another potential savings if the measures for the conversion can be inexpensively implemented. Through the use of mechanically accessible supply lines to switch between operating states, it is possible to create a switching device, i.e. the device that generates the required current pulse can be used multiple times. In particular, the manufacture of the circuit in the assembly according to the invention is not needlessly made more expensive through costly adaptation circuits as in the prior art.

In an advantageous modification, the supply lines have at least a double function, i.e. at least two electrical functions and/or functionalities; the first function is implemented as the provision of the current pulse for the irreversible change of the electrical component.

This embodiment according to the invention is based on the idea that in assemblies, the number of electric interfaces, i.e. supply lines and/or bushings or the like, should be limited. On the one hand, a larger number of interfaces entails an increase in production cost and on the other hand, a reduction in the number of electrical interfaces in particular requires the encapsulated assemblies to be easy to install and integrate. It is also necessary to take into account the fact that in particular, encapsulated assemblies are often sealed and a reduction in the number of interfaces reduces the risk of an insufficient seal. One advantage of the present embodiment, therefore, is the fact that despite the possibility of the switching, only those electrical interfaces that are required for the operation, i.e. in particular connection wires, are present.

It is particularly preferable if the supply lines for implementing the second function are embodied in the form of supply voltage lines since these are as a rule a crucial requirement for the operation of the assembly. It is preferable for the supply voltage lines and/or the circuit to be embodied as a low-voltage system, in particular with and/or for a DC voltage supply.

In a modification of the invention, a measure for converting an adaptable assembly is provided that is particularly simple and inexpensive because the circuit is embodied so that the switching of the operating state is implemented by reversing the polarities of the supply lines. In one concrete form, the supply voltage lines are used as the supply lines whose polarity is to be reversed.

In other words, the change in the operating state of the circuit and therefore of the assembly is achieved by applying a voltage, which has a polarity that is reversed from the normal operating state, to the connecting wires of the assembly for the DC voltage supply so that a current flow occurs; this current flow constitutes the current pulse. The current pulse irreversibly changes the electrical component and during operation, the circuit that has been changed in this way demonstrates an altered operating behavior. The circuit is preferably embodied in such a way that a length and/or height of the current pulse required to irreversibly change the electrical component is/are determined so that an inadvertent temporary polarity reversal does not yet result in the irreversible change. Preferably, the minimum time for the polarity reversal in the voltage source provided for the component is chosen to be at least 10 s, preferably at least 20 s, in particular at least 30 s.

In the concrete embodiment of the circuit, preferably a fuse, in particular a melting fuse, is chosen as the irreversibly changeable component. Particularly when a limited amount of space is available, an SMD melting fuse is used as the electrical component.

Preferably, the circuit and/or the assembly is embodied so that the current pulse can be conveyed and/or is conveyed via a series circuit of an internal selection element and the electrical component. In particular, a diode, especially a Schottky diode, is used as the internal selection element. The diode is wired so that with a normal supply voltage, the diode is operated in the inverse direction and with a reversed-polarity, i.e. an inverted supply voltage, the diode is operated in the conducting direction. With a reversed-polarity supply voltage, a current is thus conducted through the diode, which results in an irreversible change of the series-connected electrical component.

If the assembly can be operated with DC voltage during normal operation, then the selection element is alternatively embodied, for example, in the form of a capacitive coupling element, in particular a series-connected capacitor. In this instance, the current pulse is conveyed to the electrical component in the form of AC voltage. The reverse case can also be used, i.e. the circuit is embodied so that the assembly can be operated with AC voltage during normal operation and the current pulse is embodied in the form of a DC voltage pulse. Other alternatives of the selection element can utilize different frequencies and/or amplitudes of supply voltage and current pulse for the selection.

In a preferred embodiment of the assembly, the change of the operating state occurs via the change and/or inversion of a logic state. This embodiment has the advantage that the change to the electrical component can occur in a comparatively imprecise fashion since different logic states have a large potential difference and even with an incomplete change of electrical component, the logic state is changed and/or inverted. Preferably, the circuit has a processing unit, in particular a programmable processing unit, microcontroller, CPU, DSP, FPGA, ASIC, or the like with logic inputs.

In a practical modification of the assembly, an input for changing the logic state is preceded by a transistor for inverting the logic state. This modification is particularly useful in order to flexibly adapt the circuit to boundary conditions of the processing units used.

Preferably, the assembly is embodied in the form of a hermetically encapsulated, preferably cast, extra-low-voltage or low-voltage device. The encapsulation is in particular implemented in the form of a casting, for example with a synthetic resin compound, in which, after the casting, the circuit is no longer mechanically accessible. Preferably, the circuit is encapsulated in a watertight fashion and/or as the electrical interfaces, has only and/or exclusively the supply lines required for operation in the operating state. The supply voltage of the low-voltage device is up to 12V, preferably up to 24V, in particular up to 36V. The term "small-scale applications" applies in particular to devices with a mass of less than 2 kg, preferably less than 1 kg, in particular less than 0.5 kg. Preferably, the assembly is designed for use in a local security network for monitoring doors or the like.

Another subject of the invention is a method with the features of claim 10 for switching the operating state of an assembly, in which the assembly is in particular embodied as described above.

According to the invention, the assembly has supply lines for the supply voltage and the switching occurs by means of a particularly short polarity reversal of the supply voltage.

Other features and advantages of the invention ensue from the following description and the accompanying drawings of an exemplary embodiment of the assembly according to the invention.

DESCRIPTION OF THE PREFERRED EMBODIMENTS

Figure 1:
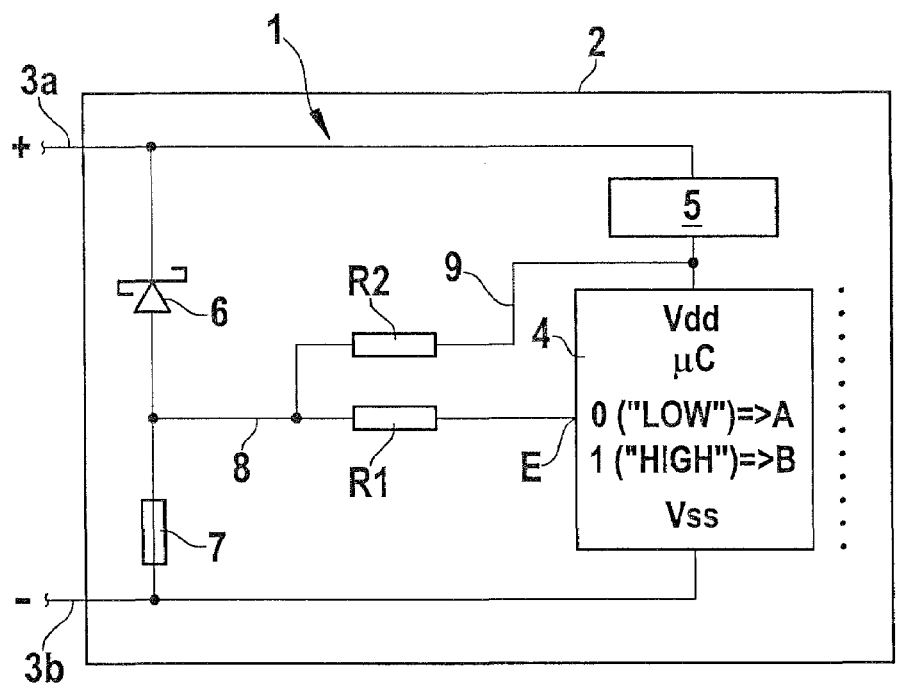
FIG. 1 is a schematic wiring diagram of a first exemplary embodiment of the invention.

In the figures, parts that are the same or are functionally equivalent have been provided with the same reference numerals.

FIG. 1 is a schematic depiction limited to only the most important components of a wiring diagram of an adaptation circuit 1 of a low-voltage small-scale application 2. The adaptation circuit 1 and other parts of the circuit are situated in the low-voltage small-scale application 2, encapsulated in plastic, thus preventing mechanical access to or interference with the adaptation circuit 1.

For example, the low-voltage small-scale application 2 is an electronic magnetic contact that is used in LSN systems (local security network) and is embodied for communication with the LSN. In order to keep the magnetic contact compatible with earlier versions of the LSN and therefore make it unnecessary to stock a separate variant of the magnetic contact for each version of the LSN, this magnetic contact has the adaptation circuit 1 with the aid of which the transmission protocol of the magnetic contact can either be set for the current version of the LSN or can be adjusted to the earlier version of the LSN.

The low-voltage small-scale application 2 has two supply lines 3a and b, which connect a low-level DC voltage source (not shown) to the low-voltage small-scale application 2 and in particular to the adaptation circuit 1. The supply line 3a in this case is connected to the positive terminal while the supply line 3b is connected to the negative terminal.

Implemented in the adaptation circuit 1, the low-voltage small-scale application 2 has a microcontroller 4 that can access two different protocols A or B for communication with the LSN (not shown).

The selection of the protocol is carried out in conjunction with the signal applied to an input E. In this exemplary embodiment, with the application of a logical "LOW" signal, the microcontroller 4 selects the protocol A and with the application of a logical "HIGH" signal, the microcontroller 4 selects the protocol B and uses it for the communication.

In order for the supply voltage applied by means of the supply lines 3a and b to be adapted to the microcontroller 4, an internal power supply 5 is provided. The supply lines 3a and b are connected in short-circuit fashion via a series circuit comprised of a diode 6 and a fuse 7. The diode 6 is wired in such a way that with the correct application of the supply voltage for the normal operation of the low-voltage small-scale application 2, a flow of current between the supply lines 3a and b via the series circuit is prevented, i.e. suppressed.

Between the diode 6 and the fuse 7, a signal line 8 branches off and leads via a first resistor R1 to the input E of the microcontroller 4. In addition, another connecting line 9 is provided, which connects the output of the power supply 5, which has a positive potential, to the signal line 8 via a second resistor R2.

In terms of function, in the arrangement shown, the microcontroller 4 executes the protocol A since the input E of the microcontroller 4 is connected via the resistor R1, the fuse 7, and the supply line 3b to the negative terminal of the voltage source, not shown, and the input E is thus connected to a "LOW" potential.

In order to switch the microcontroller 4 to the protocol B, the low-voltage small-scale application 2 is temporarily connected with reverse polarity to the voltage source, not shown, so that the supply line 3a is connected to the negative terminal and the supply line 3b is connected to the positive terminal. In this arrangement, the diode 6 is operated in the conducting direction so that a current pulse, in particular a short-circuit current, flows through the diode 6 and fuse 7 and blows the fuse 7. The fuse 7 in this instance is matched to the voltage source so that a particular amount of time is required for the blowing of the fuse 7 and an inadvertent temporary polarity reversal does not result in a change to the fuse 7.

After the irreversible change of the fuse 7 by means of melting or blowing and after the subsequent polarity reversal of the voltage source back into the arrangement shown in FIG. 1, the fuse 7 is permanently and irreversibly melted so that at this point, there is an interruption in the lines. During operation, then, the input E the microcontroller 4 is connected via the resistors R1 and R2 to the output of the power supply 5, which has a positive potential, so that a "HIGH" potential is present at the input E and the microcontroller 4 uses the protocol B. The switch from protocol A to protocol B is irreversible and cannot be subsequently canceled.

Figure 2:
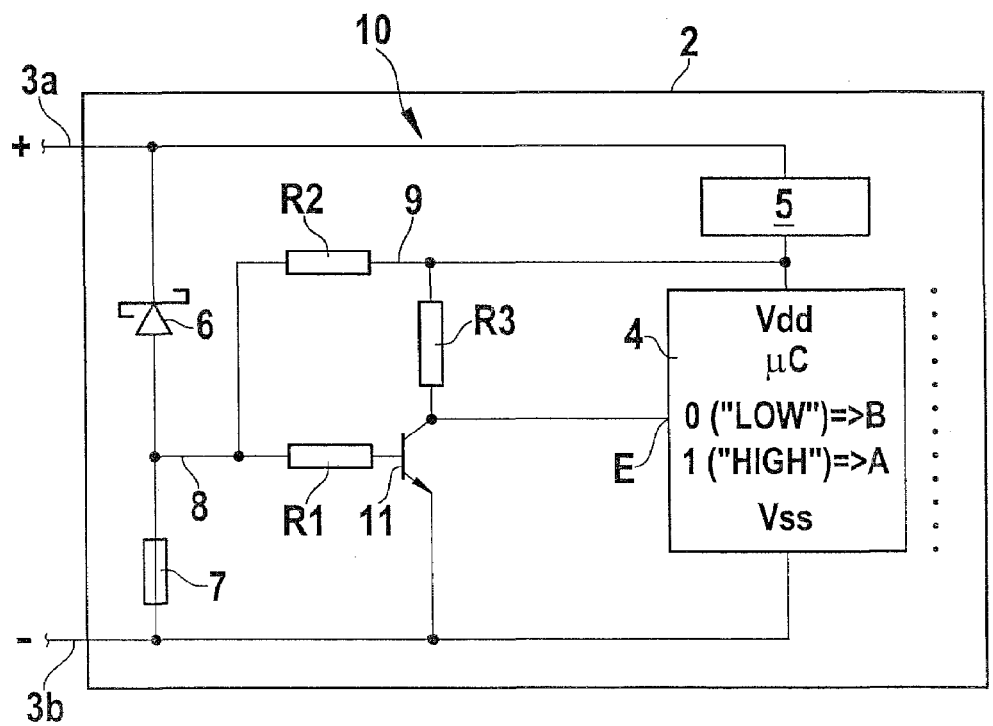
FIG. 2 is a schematic wiring diagram of a modification of the first exemplary embodiment.

FIG. 2 shows a modification based on the exemplary embodiment in FIG. 1, which, by contrast with the adaptation circuit 1 in FIG. 1, also has an inversion of the logic state. The principal layout of the circuit 10 in FIG. 2 is similar to that of the adaptation circuit 1 in FIG. 1 and has the same arrangement of the supply lines 3a and b, the microcontroller 4, the power supply 5, the diode 6, the fuse 7, the signal line 8, and the connecting line 9.

By contrast with the circuit 1, the microcontroller 4 in the circuit 10 is embodied and/or programmed so that with a logical "HIGH" at the input E, the protocol A is executed and when a logical "LOW" is applied, the protocol B is executed.

For inversion, an npn transistor 11 is integrated, whose base contacts the signal line 9 after the resistor R1, whose collector contacts the connecting line 9 and the power supply 5 via a third resistor R3, and whose emitter contacts the supply line 3b. In addition, the collector of the transistor 11 is connected to the input E of the microcontroller 4.

As long as the fuse 7 in the depicted arrangement remains intact, a negative potential is present at the base of the transistor 11 and a current flow is prevented between the collector and the emitter so that via the resistor R3, a positive or "HIGH" potential is present at the input E and the protocol A is active.

Immediately after a short polarity reversal of the voltage source has destroyed the fuse 7, a positive potential is present at the base of the transistor I via the resistors R2 and R1 and the connection between the collector and emitter is switched into the conductive state so that the "LOW" potential of the negative terminal of the voltage source is present at the input E of the microcontroller 4 and the protocol B is activated.

Particularly for the case in which a protective diode is connected between the supply lines 3a and b in order to protect the voltage source, a Schottky diode is suitably selected for the diode 6 since the low forward voltage of this kind of diode permits a greater current without switching the protective diode into the conductive state. If the circuit must be adapted for an extremely small amount of available space, then the fuse 7 is preferably an SMD melting fuse.

In principle, it is possible to use a capacitor in lieu of a diode 7 and to achieve the switching by applying an AC voltage in lieu of reversing the polarity. It should thus be understood that the above-described exemplary embodiment can only have an exemplary character for the invention contained in the claims.

It will be understood that each of the elements described above, or two or more together, may also find a useful application in other types of constructions and methods differing from the types described above.

While the invention has been illustrated and described as embodied in a method for assembly with a mechanically inaccessible or difficult-to-access circuit and method for switching the operating state of an assembly, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in appended claims:

1. An assembly, comprising a circuit selected from the group consisting of a mechanically inaccessible circuit and difficult-to-access circuit and having an electrical component that is irreversibly changeable by a current pulse, so that the irreversible change of said component is capable of switching said circuit from a first operating state into a second operating state; and mechanically accessible supply lines via which a current pulse is suppliable for the irreversible change of said electrical component, wherein said supply lines are configured with at least a double electrical function and a first electrical function implemented as a provision of the current pulse, and wherein said supply lines are further configured so that a second electrical function is implemented as a provision of a supply voltage.

2. An assembly, comprising a circuit selected from the group consisting of a mechanically inaccessible circuit and difficult-to-access circuit and having an electrical component that is irreversibly changeable by a current pulse, so that the irreversible change of said component is capable of switching said circuit from a first operating state into a second operating state; and mechanically accessible supply lines via which a current pulse is suppliable for the irreversible change of said electrical component, wherein said circuit is configured so that the irreversible change of said component occurs through the polarity reversal of supply voltage supply lines.

3. An assembly, comprising a circuit selected from the group consisting of a mechanically inaccessible circuit and difficult-to-access circuit and having an electrical component that is irreversibly changeable by a current pulse, so that the irreversible change of said component is capable of switching said circuit from a first operating state into a second operating state; and mechanically accessible supply lines via which a current pulse is suppliable for the irreversible change of said electrical component, wherein said mechanically accessible supply lines are configured so that the change in the operating state occurs by a change in a logic state, and further comprising a transistor for inverting the logic state so that an input for changing the logic state is preceded by said transistor.

4. A method for switching an operating state of an assembly with a circuit selected from a group consisting of a mechanically inaccessible circuit and a difficult-to-access circuit, which has an electrical component that is irreversibly changeable by a current pulse, the method comprising the steps of switching the circuit from a first operating state into a second operating state by the irreversible change of the component; and supplying the current pulse for the irreversible change of the electrical component via mechanically accessible supply lines and further comprising performing the switching through polarity reversal of a supply voltage.

* * * * *